(12) United States Patent
Moriyama et al.

(10) Patent No.: US 6,838,305 B2
(45) Date of Patent: Jan. 4, 2005

(54) METHOD OF FABRICATING A SOLID-STATE IMAGING DEVICE

(75) Inventors: Kazuaki Moriyama, Kumamoto (JP); Takeshi Matsuda, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/647,390

(22) Filed: Aug. 26, 2003

(65) Prior Publication Data

US 2004/0082095 A1 Apr. 29, 2004

(30) Foreign Application Priority Data

Aug. 30, 2002 (JP) .................................. P2002-255643

(51) Int. Cl.[7] .............................................. H01L 21/00
(52) U.S. Cl. ............................ 438/57; 438/48; 438/72; 438/635; 438/636; 438/651; 438/652; 438/655; 257/414; 257/437; 348/340
(58) Field of Search ........................ 438/57, 635, 636, 438/648, 72, 651, 48, 652, 655; 257/414, 437; 348/340

(56) References Cited

U.S. PATENT DOCUMENTS 6,614,479 B1 * 9/2003 Fukusho et al. ............ 348/340

2003/0038326 A1 * 2/2003 Fasen et al. ................ 257/414
2003/0138988 A1 * 7/2003 Murakami et al. ............ 438/60

FOREIGN PATENT DOCUMENTS

JP 08-078651 3/1996
JP 11-103037 4/1999

* cited by examiner

Primary Examiner—Matthew Smith
Assistant Examiner—Belur V Keshavan
(74) Attorney, Agent, or Firm—Rader, Fishman & Grauer, PLLC; Ronald P. Kananen

(57) ABSTRACT

A method of fabricating a solid-state imaging device is provided, which enables the formation of an anti-reflection film by oxidizing a surface of a metallic light-shield film without adding additional steps, even though the metallic light-shield film is composed of not only refractory metal silicide but also metals, including tungsten and molybdenum. The method comprises the steps of forming a metallic light-shield film on a light receiving sensor and a transfer electrode formed on a surface layer of a wafer, forming an opening on the metallic light-shield film on the light receiving sensor by etching, forming an interlayer film, and shaping the interlayer film into a lens shape by heat treatment. An atmosphere of either one or both of oxygen gas and ozone gas is prepared in a chamber for forming the interlayer film, and a surface of the metallic light-shield-film is oxidized before the interlayer film is formed.

2 Claims, 5 Drawing Sheets

METHOD OF FABRICATING A SOLID-STATE IMAGING DEVICE

CROSS REFERENCE TO RELATED APPLICATIONS

The present document is based on Japanese Priority Document JP 2002-255643, filed in the Japanese Patent Office on Aug. 30, 2002, the entire contents of which are incorporated herein by reference.

BACKGROUND OF THE INVENTION

1. Field of the invention

The invention relates to a method for fabricating a solid-state imaging device in which a metallic light shield film is formed to avoid light coming into an area other than a light receiving sensor.

2. Description of Related Art

FIGS. 4A to 4D show steps of a conventional fabricating process of a solid-state imaging device. Conventionally, a solid-state imaging device is obtained by forming a metallic light-shield film 9 on the light receiving sensor 2 and the transfer electrode 7, as shown in FIG. 4A, after forming a light receiving sensor 2 that receives incoming light and saves it as electric charge and a transfer electrode 7, which transfers the saved electric charge on a surface layer of a wafer 1.

In addition, as shown in FIG. 4B, an opening is formed on the light receiving sensor 2 of the metallic light-shield film 9 by etching, and, as shown in FIG. 4C, an interlayer film 13 is formed thereon by a CVD process to embed the light receiving sensor 2 and the transfer electrode 7. Then, the interlayer film 13 is reflowed by heat treatment or the like to have the shape of a lens, and a lens material 14 is filled to embed the reflowed interlayer film 13 so as to form an inner-layer lens.

FIG. 5 is a cross-sectional view of the solid-state imaging device obtained in accordance with the above-described process. In a conventional solid-state imaging device, light converged through an interlayer lens is photoelectrically converted when it enters through the light receiving sensor 2 from an opening in the metallic light-shield film 9. It is, however, impossible to suppress a reflective component which enters into the transfer electrode 7 as a reflection off of the metallic light-shield film 9, resulting in the incoming light being smeared. Such a component will hereinafter be referred to as a "smear component".

Conventionally, there is a solid-state imaging device in which an anti-reflection film is formed to prevent light reflected off the interlayer film constituting the interlayer lens or the like from entering into the imaging device (see, for example, Japanese Patent Application Publication No. Hei 11-103037, hereinafter referred to as "Patent Document 1"). This solid-state imaging device is made according to a process further including a step of forming the anti-reflection film on the interlayer film and a step of forming an anti-reflection film on the inner-layer lens, in addition to the conventional fabrication process of a solid-state imaging device.

In addition, there is another solid-state imaging device in which the reflectivity of a metal light-shield film is lowered by forming the metal light-shield film composed of a refractory metal silicide or the like on an interlayer dielectric, poly-crystallizing the metal light-shield film with a heat treatment on a wafer on which the metal light-shield film is formed at a high temperature of 800° C. or higher, and oxidizing a surface of the poly-crystallized metal light-shield film (see, for example, Japanese Patent Application Publication No. Hei 8-78651, hereinafter referred to as "Patent Document 2").

As disclosed in Patent Document 1, in order to obtain a solid-state imaging device in which an anti-reflection film is formed on the interlayer film and on the inner-layer lens, it is necessary that the fabrication process further includes a step of newly forming an anti-reflection film in addition to the conventional fabrication process of a solid-state imaging device. The step of forming the anti-reflection film is carried out in an apparatus different from that used for the steps before and after the formation thereof. Accordingly, it takes time to convey the films into and out from each apparatus, such that the time duration until completing the product fabrication will be long.

In addition, Patent Document 2 discloses that the surface of the metal light-shield film is oxidized at a high temperature of 800° C. or higher. Refractory metal silicide is the only refractory metal which can withstand such a high temperature. Since a light-shield film composed of a metal such as tungsten (W) and molybdenum (Mo) will oxidize too much under heat treatment in an oxidizing atmosphere at a temperature of 800° C. or higher, even though it is a refractory metal, it cannot be used as a light-shield film.

SUMMARY OF THE INVENTION

Therefore, in the present invention, a method of fabricating a solid-state imaging device is provided which enables the formation of an anti-reflection film by oxidizing a surface of a metallic light-shield film without the addition of a fabrication step, even though the metallic light-shield film is composed of not only the refractory metal silicide but also metals, including tungsten and molybdenum.

The method of fabricating a solid-state imaging device of the present invention is a method comprising the steps of forming a metallic light-shield film on a light receiving sensor and a transfer electrode formed on a surface layer of a wafer, forming an opening on the metallic light-shield film on the light receiving sensor by etching, forming an interlayer film, and shaping the interlayer film to be a lens shape by heat treatment. In the method, an atmosphere of either one or both of oxygen gas and ozone gas is prepared in a chamber for forming the interlayer film, and a surface of the metallic light-shield film is oxidized before the interlayer film is formed.

According to the present fabrication method, in the step of forming the interlayer film in the process of fabricating a solid-state imaging device, an anti-reflection film can be formed by oxidizing the surface of the metallic light-shield film by exposing the surface in the atmosphere of either one or both of the oxygen gas and the ozone gas before the interlayer film is formed in the same chamber as that used for forming the interlayer film.

At this time, it is possible to oxidize the surface of the metallic light-shield film even though a temperature in the chamber is 500° C. or lower. Therefore, it is possible to form the anti-reflection film by oxidizing the surface of the metallic light-shield film without damaging it, even if the metallic light-shield film is composed of not only the refractory metal silicide but also metals including tungsten and molybdenum.

The present invention may result in the following effects.

(1) By creating an atmosphere of one or both of oxygen gas and ozone gas in a chamber used for forming an interlayer film and oxidizing a surface of a metallic light-shield film, an anti-reflection film can be formed by oxidizing the surface of the metallic light-shield film with the oxygen gas and the ozone gas in the chamber, which chamber is also used for forming the interlayer film. Accordingly, it is unnecessary to add further fabrication steps employing the use of another chamber.

(2) Since the oxidation is carried out with the oxygen gas and the ozone gas in the chamber, which chamber is also used for forming the interlayer film, it is possible to freely control a flow rate of the oxygen gas and the ozone gas and oxidation reaction time so that an anti-reflection film having an optimal thickness can be formed by controlling the oxidation level of the surface of the metallic light-shield film.

(3) Since the oxidation is carried out in the chamber by setting the temperature to 500° C. or lower and using the oxygen gas and the ozone gas, it is possible to form the anti-reflection film by oxidizing the surface of the metallic light-shield film without damaging it, even if the metallic light-shield film is composed of not only the refractory silicide, such as WSi, but also metals, including W and Mo.

The effects of the present invention are not limited to those described above. The present invention may result in additional effects derived from the above, aside from those explicitly enumerated.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 1A to 1E are cross-sectional views showing steps of a fabrication process of a solid-state imaging device in a first embodiment of the present invention, in which FIG. 1A shows a step of forming a metallic light-shield film, FIG. 1B a step of etching, FIG. 1C a step of oxidation, FIG. 1D a step of forming an interlayer film, and FIG. 1E a step of forming a lens.

DESCRIPTION OF THE PREFERRED EMBODIMENTS

Figure 1:
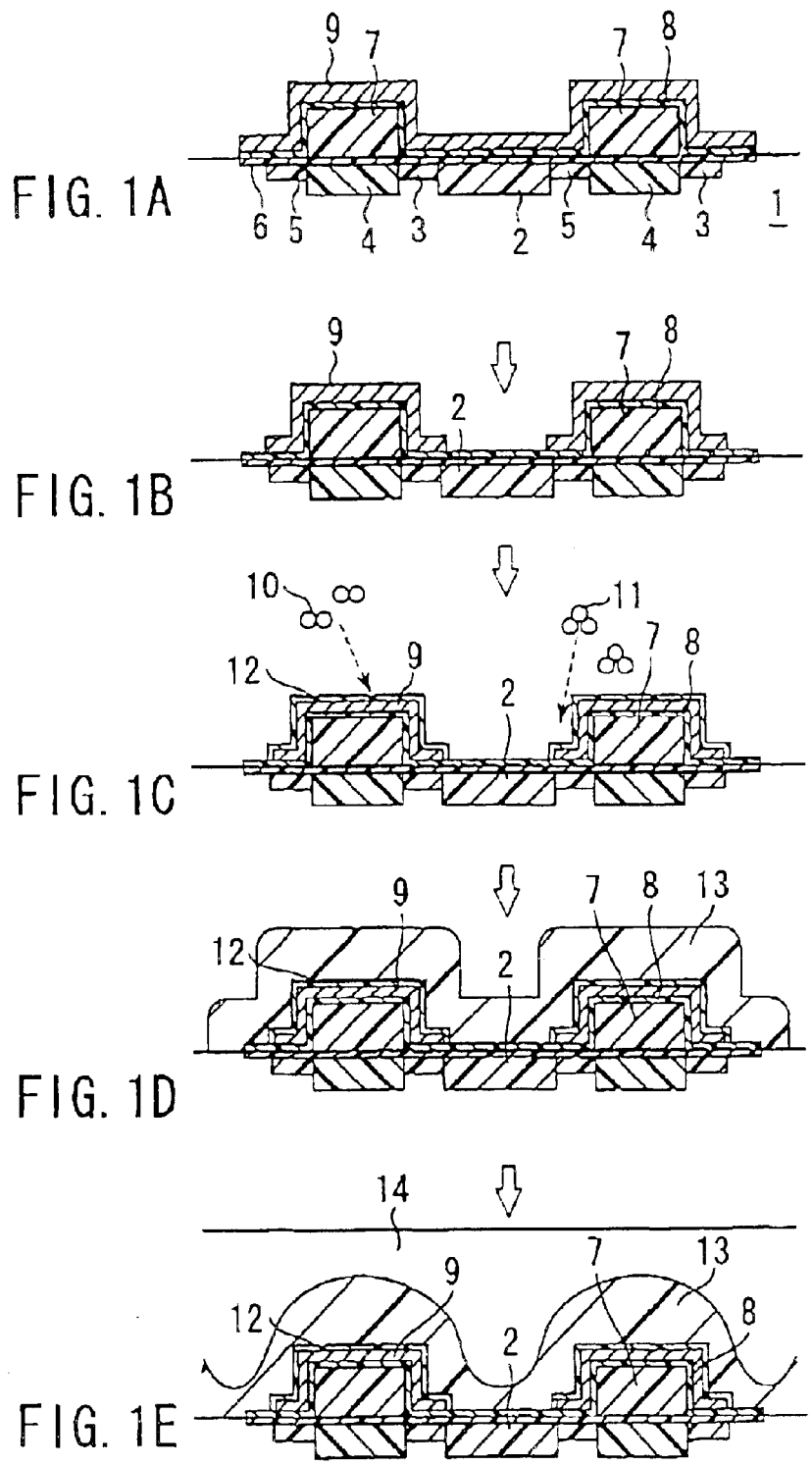
Figure 2:
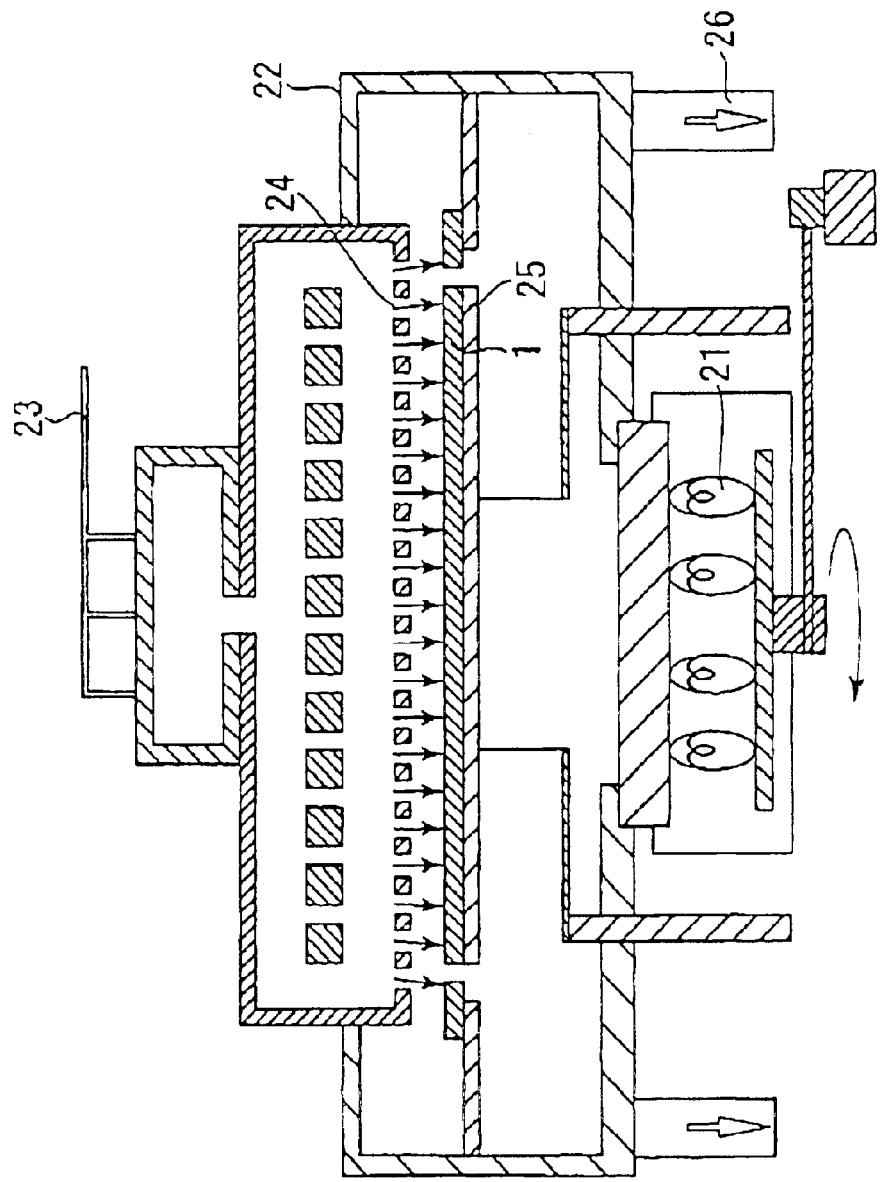
FIG. 2 is a cross-sectional cross-sectional view schematically showing a chamber used in the step of forming the interlayer shown in FIG. 1D.

FIGS. 1A to 1E are cross-sectional cross-sectional views showing steps of fabricating a solid-state imaging device in an embodiment of the present invention, and FIG. 2 is a cross-sectional view schematically showing a chamber used in a step of forming an interlayer film shown in FIG. 1D. A fabrication process of a solid-state imaging device according to the present embodiment will now be described with reference to FIGS. 1A to 1E.

First, as shown in FIG. 1A, a light receiving unit (not shown) performing photoelectric conversion is formed on a surface layer of a wafer 1. A hole accumulation unit (not shown) is formed further thereon so as to form a light receiving sensor 2 of a HAD (Hole-Accumulation Diode: registered trademark) structure comprising the light receiving unit and the hole accumulation unit.

In addition, a charge transfer unit 4 is formed on a side of the light receiving sensor 2 having a charge reader unit 3 disposed therebetween, and a channel stop unit 5 is formed on the other side of the light receiving sensor for blocking charge flowing into the charge transfer unit 4 adjacent thereto. Furthermore, an insulating film 6 composed of $SiO_2$ or the like is formed by a thermal oxidation process or a CVD process on a surface of the wafer 1.

A transfer electrode 7 composed of polysilicon or the like is formed at a position almost right above the charge transfer unit 4 on the insulating film 6. Furthermore, another transfer electrode (not shown) composed of polysilicon or the like is formed to overlap with a portion of transfer electrode 7. An interlayer dielectric 8, composed of $SiO_2$ or the like, covering the transfer electrode 7 and the insulating film 6 on the light receiving sensor 2 positioned between the transfer electrodes 7, is formed on the surface, that is, on the top and side planes of the transfer electrode 7.

A metallic light-shield film 9 is formed on the interlayer dielectric 8 to cover the transfer electrode 7. Then, as shown in FIG. 1B, the majority of the portion of the interlayer dielectric layer 8 formed above the light receiving sensor 2 is etched off to create an opening. A number of metals may be used as the metallic light-shield film 9, including W, Mo, Al and the like or WSi being a refractory metal silicide, as long as they can withstand oxidation at a temperature of 500° C. or lower.

Next, an interlayer film 13 (see FIG. 1D) is formed using a CVD apparatus, as shown in FIG. 2. The CVD apparatus shown in FIG. 2 is used to uniformly introduce a material gas supplied from a gas line 23 through a shower head 24 in a chamber 22 heated to a temperature of 500° C. or lower, for example, around 380° C. to 400° C., by a heater lamp 21 so as to deposit a product created by a reaction of the material gas on the wafer 1 placed on a stage 25 in the chamber 22.

In the fabrication process of the present embodiment, oxygen gas 10 and/or ozone gas 11 is introduced to the gas line 23 before the material gas for forming the interlayer film 13; that is, before forming the interlayer firm 13 (see FIG. 1C). Accordingly, an atmosphere such as the oxygen gas 10 and/or the ozone gas 11 at a temperature of 500° C. or lower is filled in the chamber 22 so that the wafer 1 on the stage 25 is exposed in the atmosphere. Therefore, the surface of the metallic light-shield film 9 on the wafer 1 is oxidized so that an anti-reflection film 12 is formed.

After the anti-reflection film 12 is formed, the oxygen gas 10 and/or the ozone gas 1 is exhausted from an exhaust pipe 26, and then, a material gas (for example, TEOS (tetraethoxysilane)) for forming the interlayer film 13 is introduced in the chamber 22. Therefore, the interlayer film 13 composed of $SiO_2$ or the like is formed to cover the anti-reflection film 12 and the interlayer dielectric 8 exposed right above the light receiving sensor 2.

Next, the interlayer film 13 is reflowed by heat treatment or the like to have the shape of a lens, and a lens material 14 such as SiN is filled to embed the reflowed interlayer film 13. In this way, an inner-layer lens is formed between the lens material 14 and the interlayer film 13 and a solid-state imaging device is completed.

Figure 3:
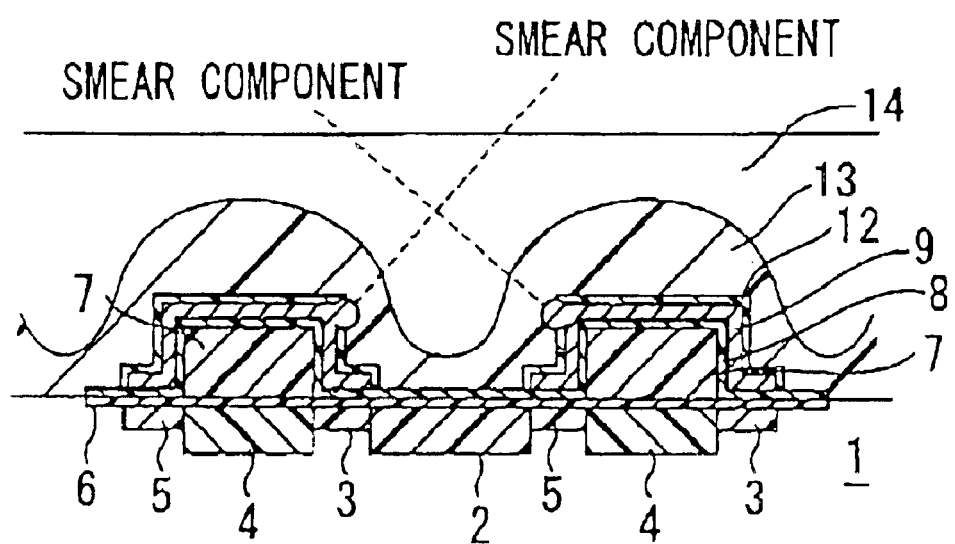
FIG. 3 is a cross-sectional cross-sectional view of a solid-state imaging device obtained through the fabrication process of the present embodiment.
Figure 4A:
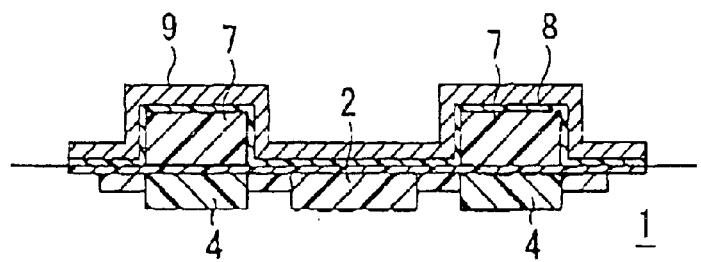
FIGS. 4A to 4D are cross-sectional views showing steps of a conventional fabrication process of a solid-state imaging device.
Figure 4B:
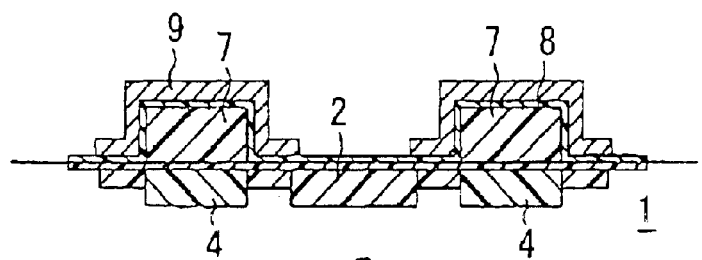
Figure 4C:
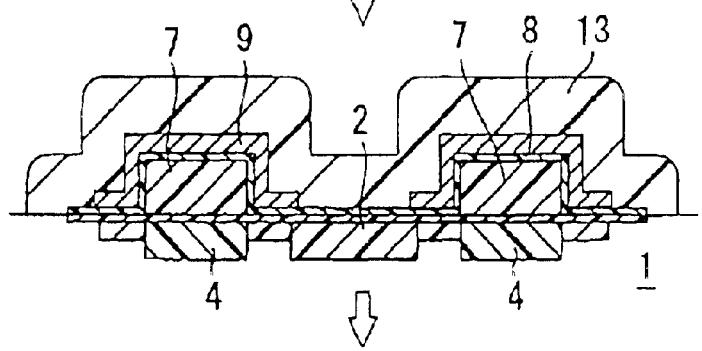
Figure 4D:
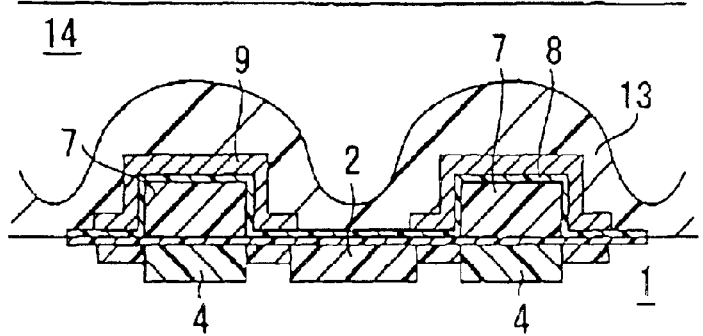
Figure 5:
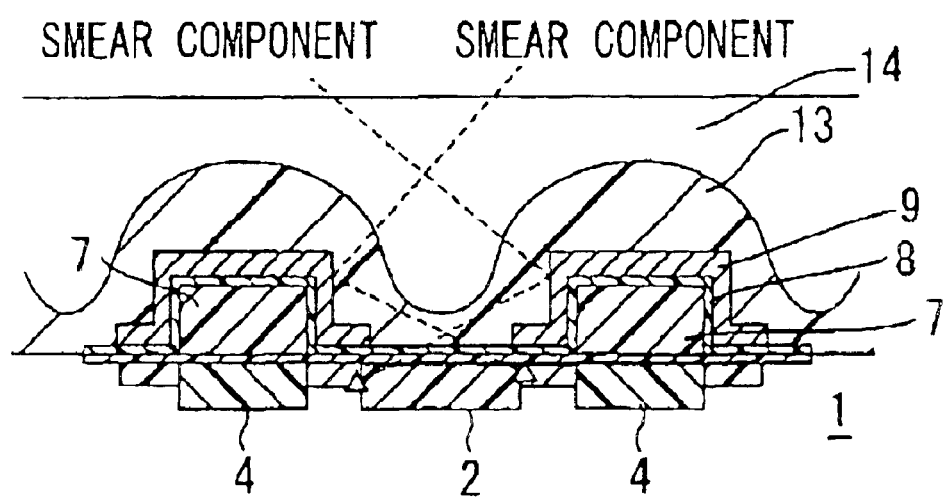
FIG. 5 is a cross-sectional cross-sectional view of a conventionally obtained solid-state imaging device.

FIG. 3 is a cross-sectional view of the solid imaging device obtained in accordance with the above process. In the solid-state imaging device, a light coming through the inner-layer lens is photoelectrically converted in the light receiving sensor 2, and a signal charge obtained by the photoelectrical conversion is read out to the charge transfer unit 4 via the charge reader unit 3 and is further transferred by the transfer electrode 7.

A portion of the light coming through the inner-layer lens and reaching the transfer electrode 7 reflects on the metallic light-shield film 9. However, in the solid-state imaging device of the present embodiment, since the anti-reflection film 12 is formed by oxidizing the surface of the metallic light-shield film 9, the smear components reflecting on the metallic light-shield film 9 cancel each other due to interference thereof to be reduced. Accordingly the smear component, which conventionally enters into the transfer electrode 7 after reflecting on the metallic light-shield film 9, is substantially reduced, resulting in improved yield.

In addition, in the fabrication process of the solid-state imaging device according to the present embodiment, before the interlayer film 13 is formed, the anti-reflection film 12 is formed by oxidizing the surface of the metallic light-shield film 9 using the oxygen gas 10 and/or the ozone gas 11 in the same chamber 22 as that used for forming the interlayer film 13. The interlayer film 13 is formed subsequently, and thus, additional steps using chambers are not required. In other words, the anti-reflection film 12 can be formed without increasing the number of steps used.

In addition, since the oxidation is carried out with the oxygen gas 10 and/or the ozone gas 11 in the same chamber 22 as that used for forming the interlayer film 13, it is possible to freely control an oxidation reaction time by adjusting a flow rate of the oxygen gas 10 and the ozone gas 11 from the shower head 24, or by adjusting the time duration thereof until the gases are discharged from the exhaust pipe 26. Therefore, it is possible to form the anti-reflection film 12 having an optimal thickness by controlling an oxidation level of the surface of the metallic light-shield film 9.

Furthermore, in the present embodiment, since the oxidation is carried out in the chamber 22 setting the temperature to 500° C. or lower and using the oxygen gas 10 and/or the ozone gas 11, it is possible to form the anti-reflection film 12 by oxidizing the surface of the metallic light-shield film 9 without damaging it, even if the metallic light-shield film 9 is composed of not only the refractory silicide, such as WSi, but also metals, including W and Mo.

In the present embodiment, the gas introduced in the chamber 22 before forming the interlayer film 13 may consist of oxygen gas 10 alone, the ozone gas 11 alone, or the ozone gas 11 containing the oxygen gas 10. However, it is preferable to introduce more components of the ozone gas 11 than oxygen gas 10 since it results in faster oxidation of the surface of the metallic light-shield film 9.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method of fabricating a solid-state imaging device comprising the steps of forming a metallic light-shield film on a light receiving sensor and a transfer electrode formed on a surface layer of a wafer, forming an opening on the metallic light-shield film on the light receiving sensor by etching, forming an interlayer film, and shaping the interlayer film to be a lens shape by heat treatment, wherein:

an atmosphere of either one or both of oxygen gas and ozone gas is prepared in a chamber for forming said interlayer film, and a surface of said metallic light-shield film is oxidized before said interlayer film is formed.

2. The method of fabricating a solid-state imaging device as claimed in claim 1, wherein a temperature in said chamber is set to 500° C. or lower.

* * * * *